United States Patent
Nath et al.

(10) Patent No.: US 9,310,422 B2
(45) Date of Patent: Apr. 12, 2016

(54) METHODS AND APPARATUS FOR TESTING SMALL FORM FACTOR ANTENNA TUNING ELEMENTS

(75) Inventors: Jayesh Nath, Milpitas, CA (US); Liang Han, Sunnyvale, CA (US); Matthew A. Mow, Los Altos, CA (US); Hagan O'Connor, Monte Sereno, CA (US); Joshua G. Nickel, San Jose, CA (US); Peter Bevelacqua, San Jose, CA (US); Mattia Pascolini, Campbell, CA (US); Robert W. Schlub, Cupertino, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 623 days.

(21) Appl. No.: 13/487,149

(22) Filed: Jun. 1, 2012

(65) Prior Publication Data

US 2013/0321012 A1 Dec. 5, 2013

(51) Int. Cl.
*G01R 31/00* (2006.01)
*G01R 31/28* (2006.01)
*G01R 1/04* (2006.01)

(52) U.S. Cl.
CPC .......... *G01R 31/2808* (2013.01); *G01R 1/0408* (2013.01); *G01R 31/2822* (2013.01); *G01R 31/2837* (2013.01)

(58) Field of Classification Search
CPC .... G01R 1/067; G01R 29/10; G01R 31/2822; G01R 31/3025
USPC .......................................................... 324/750.02
See application file for complete search history.

(56) References Cited

U.S. PATENT DOCUMENTS

| | | | | |
|---|---|---|---|---|
| 4,843,313 | A * | 6/1989 | Walton | 324/757.04 |
| 5,861,759 | A * | 1/1999 | Bialobrodski et al. | 324/750.23 |
| 6,744,268 | B2 | 6/2004 | Hollman | |
| 7,567,883 | B2 * | 7/2009 | Heaton et al. | 702/118 |
| 7,675,300 | B2 | 3/2010 | Baur et al. | |
| 7,746,053 | B2 * | 6/2010 | Ribeiro et al. | 324/95 |
| 7,969,173 | B2 | 6/2011 | Dunklee | |
| 8,044,673 | B1 | 10/2011 | Burgyan | |
| 2002/0057098 | A1 * | 5/2002 | Aldaz et al. | 324/757 |
| 2007/0099447 | A1 * | 5/2007 | Hayashi et al. | 439/73 |
| 2011/0291679 | A1 * | 12/2011 | Pagani | 324/750.01 |
| 2013/0106455 | A1 * | 5/2013 | Edwards et al. | 324/754.1 |

* cited by examiner

*Primary Examiner* — Alesa Allgood
(74) *Attorney, Agent, or Firm* — Treyz Law Group; Jason Tsai; Joseph F. Guihan

(57) ABSTRACT

A test system for testing a device under test (DUT) is provided. The test system may include a DUT receiving structure configured to receive the DUT during testing and a DUT retention structure that is configured to press the DUT against the DUT receiving structure so that DUT cannot inadvertently shift around during testing. The DUT retention structure may include a pressure sensor operable to detect an amount of pressure that is applied to the DUT. The DUT retention structure may be raised and lowered vertically using a manually-controlled or a computer-controlled positioner. The positioner may be adjusted using a coarse tuning knob and a fine tuning knob. The positioner may be calibrated such that the DUT retention structure applies a sufficient amount of pressure on the DUT during production testing.

9 Claims, 15 Drawing Sheets

METHODS AND APPARATUS FOR TESTING SMALL FORM FACTOR ANTENNA TUNING ELEMENTS

BACKGROUND

This relates generally to wireless communications circuitry, and more particularly, to electronic devices having wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too narrow, the antenna will not be able to cover all communications bands of interest.

In view of these considerations, it would be desirable to provide antenna tuning elements that allow the antenna to cover a wider range of frequency bands. Moreover, it may be desirable to provide ways for testing the antenna tuning elements prior to being assembled within a finished product without damaging the antenna tuning elements.

SUMMARY

A wireless electronic device may include storage and processing circuitry and wireless communications circuitry. The wireless communications circuitry may include a baseband processor, transceiver circuitry, and at least one antenna. The antenna may include an antenna resonating element and at least one antenna tuning element. The antenna tuning element may be used to help the antenna cover a wider range of communications frequencies than would otherwise be possible.

The tunable element may include radio-frequency switches, continuously or semi-continuously tunable resistive/inductive/capacitive components forming using integrated circuits, discrete surface mount components, or other suitable conductive structures, and other load circuits configured to provide desired impedance characteristics for the antenna at selected frequencies.

In accordance with an embodiment of the present invention, a test system may be provided that includes a device receiving structure (e.g., a test substrate), test host (e.g., a personal computer), a radio-frequency tester (e.g., a vector network analyzer), a power supply unit, cabling (e.g., coaxial cables) for coupling the radio-frequency tester to the device receiving structure, and other test equipment. The antenna tuning element currently being tested by the test system may be referred to as a device under test (DUT), a device component under test, or a circuit under test (CUT). The power supply unit may optionally be used to supply power to the DUT during testing. The test host may send control signals to the DUT that places the DUT in a desired one of multiple possible operating states. The DUT may be mated with the device receiving structure during testing.

The test system may also include a device retention structure configured to press against the DUT with a calibrated amount of force (pressure) so that DUT is properly mated with the device receiving structure and so that DUT does not shift around during testing. The amount of force with which the device retention structure presses against the DUT may be determined using device retention structure calibration operations.

The device retention structure may include a pressure sensor operable to generate a pressure sensor output indicative of the amount of force that is applied by the device retention structure. The device retention structure may be positioned over the DUT at a height that is controlled by a positioning device (e.g., a computer-controlled positioner or a manually-controlled positioner). The positioning device may, for example, include a first position adjustment mechanism for adjusting the height of the device retention structure with a first degree of accuracy (e.g., a coarse height adjustment mechanism) and a second position adjustment mechanism for adjusting the height of the device retention structure with a second degree of accuracy that is greater than the first degree of accuracy (e.g., a fine height adjustment mechanism).

During calibration, the first position adjustment mechanism may be used to move the device retention structure towards the DUT until the device retention structure makes contact with the DUT. The moment at which the device retention structure makes contact with the DUT can be detected by monitoring when the pressure sensor output changes dramatically from a baseline value. Once the device retention structure is in contact with the DUT, the second position adjustment mechanism may be used to move the device retention structure towards the DUT until the pressure sensor output exceeds a predetermined threshold level.

Once the pressure sensor output exceeds the predetermined threshold level, a position adjustment setting reflective of the current state of the first and second position adjustment mechanisms may be recorded as test data. Test data may be gathered in this way for different types of DUTs. The test data may then be processed to obtain calibration data. The calibration data may be used to configure the positioner so that the device retention structures presses against the DUT with sufficient force during production testing (e.g., while the radio-frequency tester is being used to obtain radio-frequency measurements from the DUT).

Further features of the present invention, its nature and various advantages will be more apparent from the accompanying drawings and the following detailed description.

DETAILED DESCRIPTION

Figure 1:
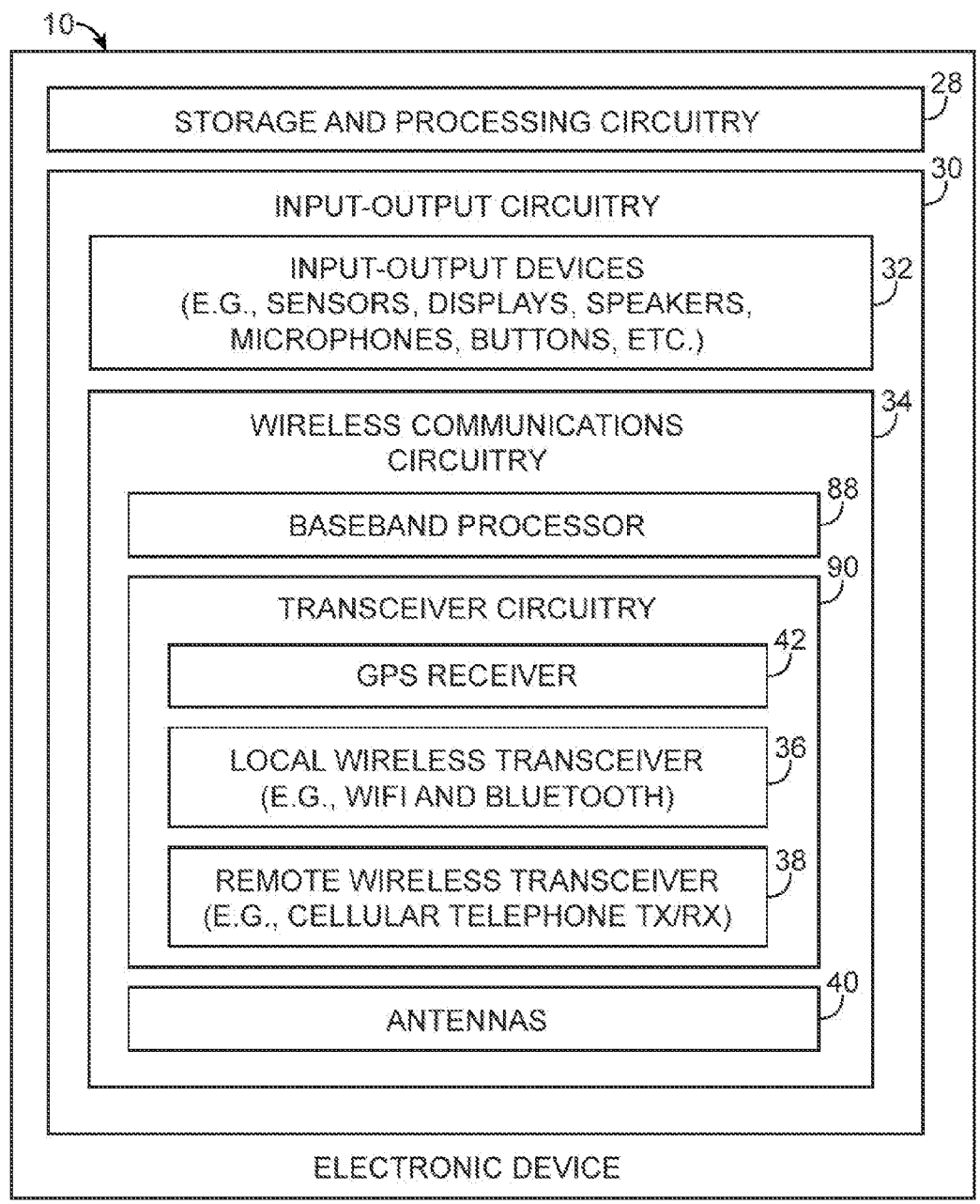
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may also include the so-called LTE (Long Term Evolution) bands. The LTE bands are numbered (e.g., 1, 2, 3, etc.) and are sometimes referred to as E-UTRA operating bands.

Device 10 may also receive long-range signals such as signals associated with satellite navigation bands. For example, device 10 may use wireless circuitry to receive signals in the 1575 MHz band associated with the Global Positioning System (GPS) and to receive signals in the 1602 MHz band associated with the Global Navigation Satellite System (GLONASS). Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, and the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor may include memory and processing circuits and may also be considered to form part of storage and processing circuitry 28 of device 10.

Baseband processor 88 may be used to provide data to storage and processing circuitry 28. Data that is conveyed to circuitry 28 from baseband processor 88 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 58) may issue control commands for controlling wireless circuitry 34. For example, baseband processor 88 may issue commands that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
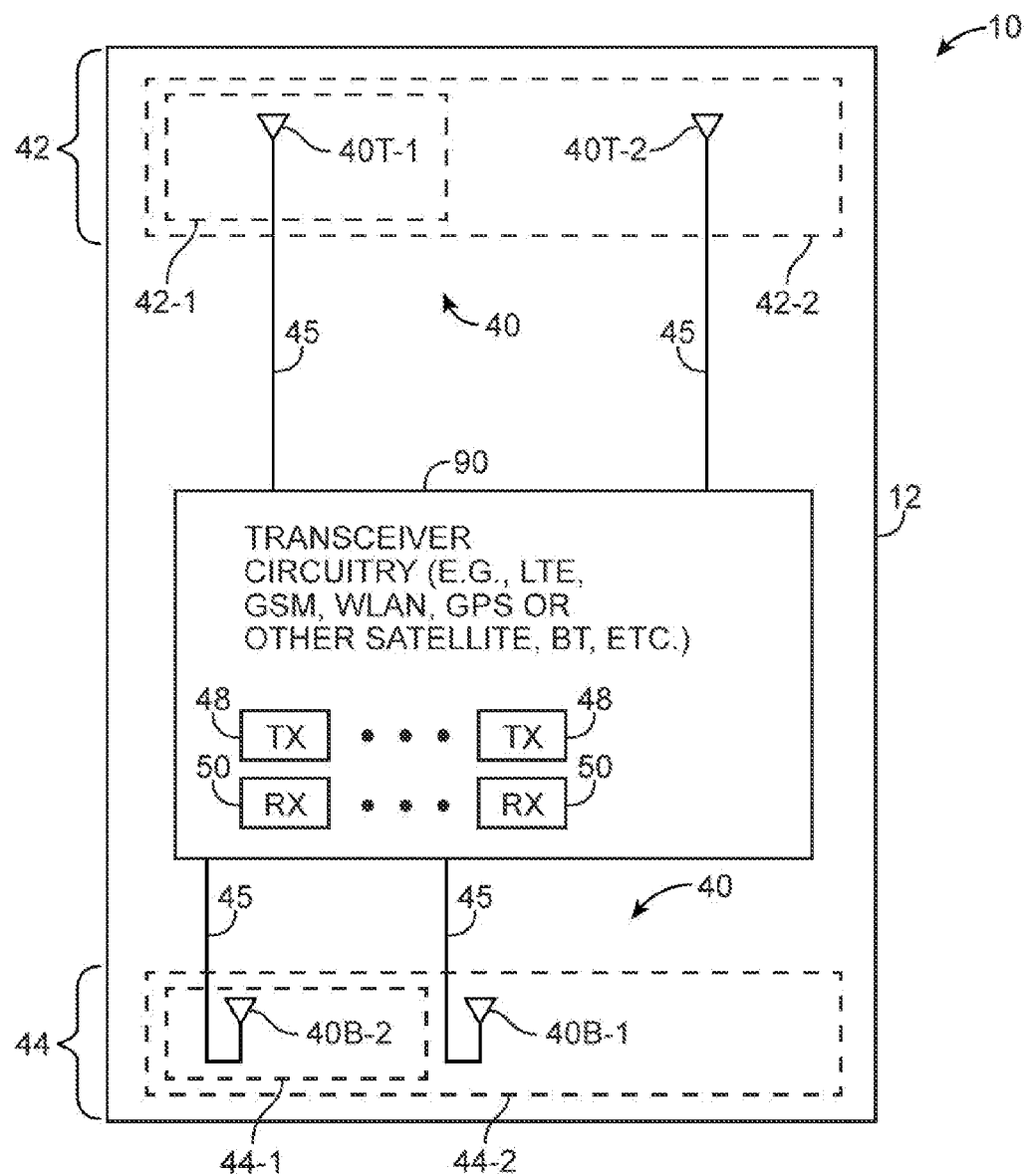
FIG. 2 is a diagram showing how radio-frequency transceiver circuitry may be coupled to one or more antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive.

For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Figure 3:
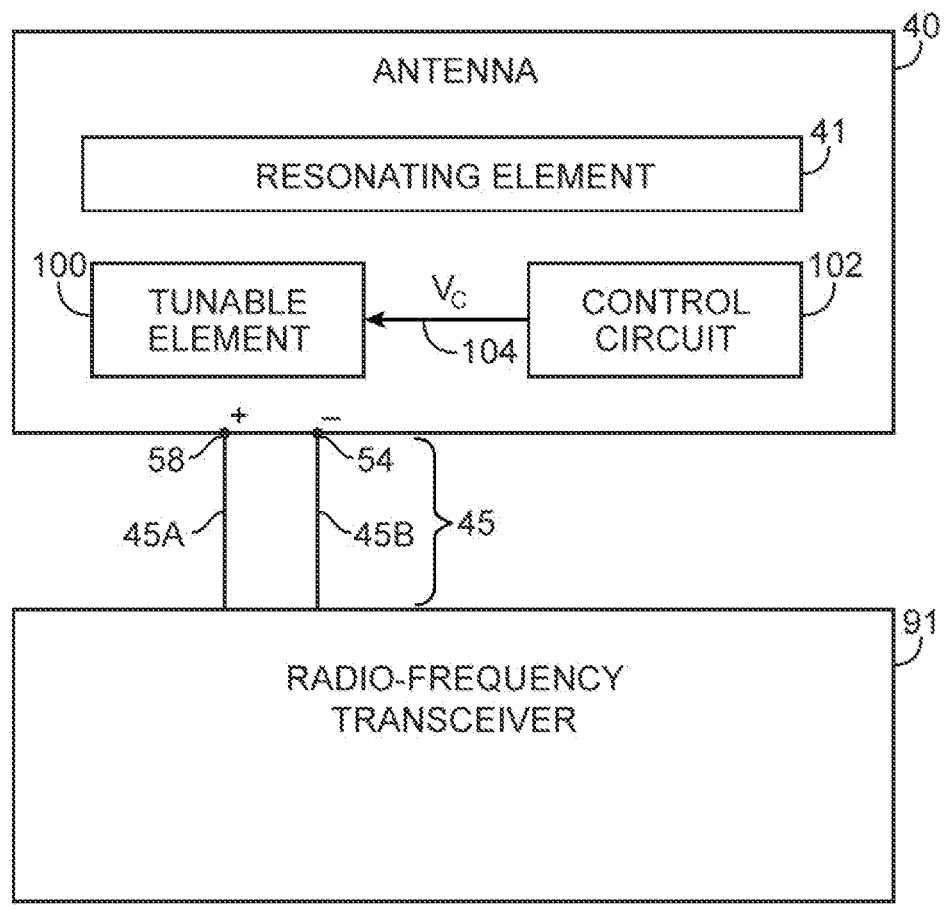
FIG. 3 is a circuit diagram showing how an antenna in the electronic device of FIG. 1 may be coupled to radio-frequency transceiver circuitry in accordance with an embodiment of the present invention.

FIG. 3 is a diagram showing how radio-frequency path 45 may be used to convey radio-frequency signals between an antenna 40 and radio-frequency transceiver 91. Antenna 40 may be one of the antennas of FIG. 2 (e.g., antenna, 40T-1, 40T-2, 40B-1, 40B-2, or other antennas). Radio-frequency transceiver 91 may include receivers and/or transmitters in transceiver circuitry 90, wireless local area network transceiver 36 (e.g., a transceiver operating at 2.4 GHz, 5 GHz, 60 GHz, or other suitable frequency), cellular telephone transceiver 38, or other radio-frequency transceiver circuitry for receiving and/or transmitting radio-frequency signals.

Conductive path 45 may include one or more transmission lines such as one or more segments of coaxial cable, one or more segments of microstrip transmission line, one or more segments of stripline transmission line, or other transmission line structures. Path 45 may include a first conductor such as signal line 45A and may include a second conductor such as ground line 45B. Antenna 40 may have an antenna feed with a positive antenna feed terminal 58 (+) that is coupled to signal path 45A and a ground antenna feed terminal 54 (−) that is coupled to ground path 45B. If desired, circuitry such as filters, impedance matching circuits, switches, amplifiers, and other radio-frequency circuits may be interposed within path 45.

As shown in FIG. 3, antenna 40 may include a resonating element 41 and antenna tuning circuitry. Resonating element 41 may be formed from a loop antenna structure, patch antenna structure, inverted-F antenna structure, slot antenna structures, planar inverted-F antenna structures, helical antenna structures, hybrids of these designs, etc. The use of antenna tuning circuitry may help device 10 cover a wider range of communications frequencies than would otherwise be possible.

In general, it is desirable for device 10 to be able to exhibit wide band coverage (e.g., for device 10 to be able to support operation in multiple frequency bands corresponding to different radio access technologies). For example, it may be desirable for antenna 40 to be capable of operating in a higher frequency band that covers the GSM sub-bands at 1800 MHz and 1900 MHz and the data sub-band at 2100 MHz, a first lower frequency band that covers the GSM sub-bands at 850 MHz and 900 MHz, and a second lower frequency band that covers the LTE band at 700 MHz, the GSM sub-bands at 710 MHz and 750 MHz, the UMTS sub-band at 700 MHz, and other desired wireless communications bands.

The band coverage of antenna 40 may be limited by its volume (i.e., the amount of space that is occupied by antenna 40 within housing 12). For an antenna having a given volume, a higher band coverage (or bandwidth) results in a decrease in gain (e.g., the product of maximum gain and bandwidth is constant). As a result, increasing the volume of antenna 40 will generally increase its band coverage. Increasing the volume of antennas, however, may not always be feasible if a small form factor is desired.

To satisfy consumer demand for small form factor wireless devices, one or more of antennas 40 may be provided with antenna tuning circuitry. The antenna tuning circuitry may include a radio-frequency tunable component such as tunable component (sometimes referred to as an adjustable antenna tuning element) 100 and an associated control circuitry such as control circuit 102 (see, e.g., FIG. 3). Tunable element 100 and/or control circuit 102 may sometimes be formed as an integral part of antenna resonating element 41 or as a separate discrete surface-mount component that is attached to antenna resonating element 41.

For example, antenna tuning element 100 may include switching circuitry based on one or more switches or continuously tunable load components. Control circuit 102 may be used to place tunable element 100 in the desired state by sending appropriate control signals Vc via path 104. The switching circuitry may, for example, include a switch that can be placed in an open or closed position. When the switch is placed in its open position (e.g., when control signal Vc has a first value), antenna 40 may exhibit a first frequency response. When the switch is placed in its closed position (e.g., when control signal Vc has a second value that is different than the first value), antenna 40 may exhibit a second frequency response. By using an antenna tuning scheme of this type, a relatively narrow bandwidth (and potentially compact) design can be used for antenna 40, if desired.

Figure 4A:
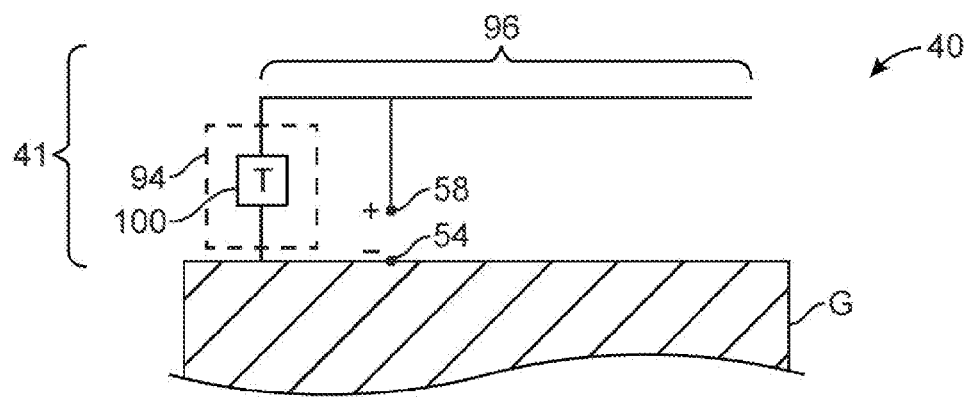
FIGS. 4A, 4B, and 4C are schematic diagrams of an illustrative inverted-F antenna containing antenna tuning elements in accordance with an embodiment of the present invention.

In one suitable embodiment of the present invention, antenna 40 may be an inverted-F antenna. FIG. 4A is a schematic diagram of an inverted-F antenna that may be used in device 10. As shown in FIG. 4A, inverted-F antenna 40 may have an antenna resonating element such as antenna resonating element 41 and a ground structure such as ground G. Antenna resonating element 41 may have a main resonating element arm such as arm 96. Short circuit branch such as shorting path 94 may couple arm 96 to ground G. An antenna feed may contain positive antenna feed terminal 58 (+) and ground antenna feed terminal 54 (−). Positive antenna feed terminal 58 may be coupled to arm 96, whereas ground antenna feed terminal 54 may be coupled to ground G. Arm 96 in the FIG. 4A example is shown as being a single straight segment. This is merely illustrative. Arm 96 may have multiple bends with curved and/or straight segments, if desired.

In the example of FIG. 4A, inverted-F antenna 40 may include an antenna tuning element 100 interposed in shorting path 94. Antenna tuning element 100 may, for example, be a switchable impedance matching network, a switchable inductive network, a continuously tunable capacitive circuit, etc.

Figure 4B:
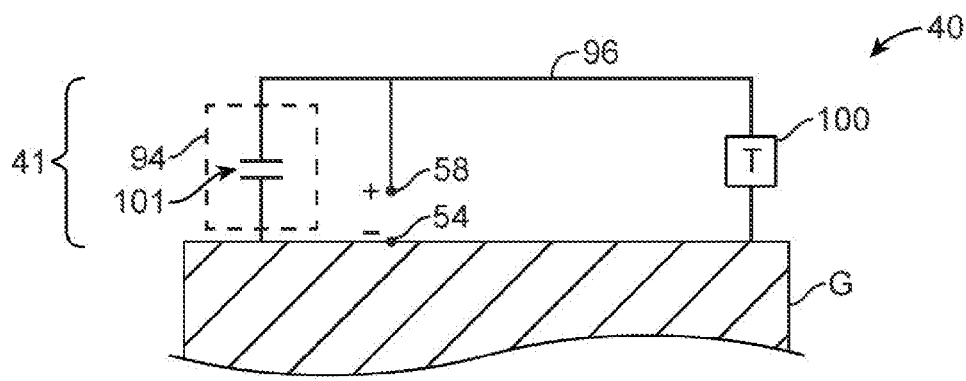

In another suitable arrangement of the present invention, resonating element 41 of inverted-F antenna 40 may include an antenna tuning element 100 coupled between the extended portion of resonating arm 96 and ground G (see, e.g., FIG. 4B). In such an arrangement, a capacitive structure such as capacitor 101 may be interposed in shorting path 94 so that antenna tuning circuit 100 is not shorted to ground at low frequencies. In the example of FIG. 4B, antenna tuning element 100 may be a switchable inductor, a continuously tunable capacitive/resistive circuit, etc.

Figure 4C:
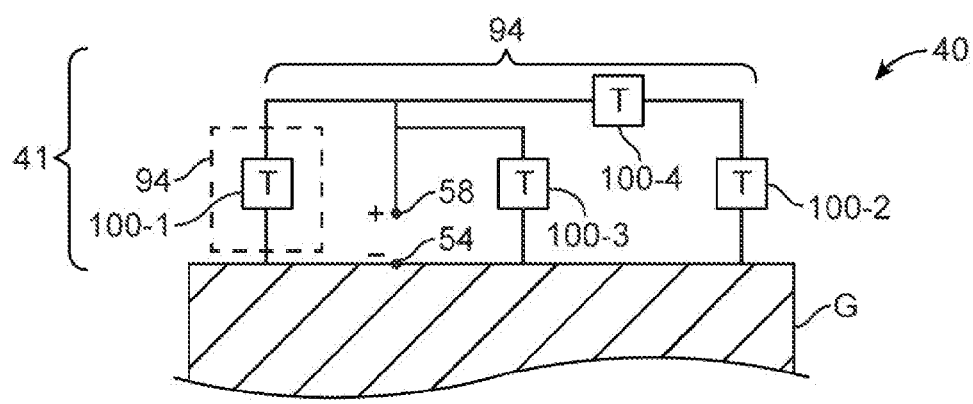

In general, antenna 40 may include any number of antenna tuning elements 100. As shown in FIG. 4C, short circuit branch 94 may include at least one tunable element 100-1 that couples arm 96 to ground. Tunable element 100-1 may be a switchable inductive path, as an example (e.g., element 100-1 may be activated to short arm 96 to ground). If desired, antenna tuning element 100-3 may be coupled in parallel with the antenna feed between positive antenna feed terminal 58 and ground feed terminal 54. Tunable element 100-3 may be an adjustable impedance matching network circuit, as an example.

As another example, antenna tuning element 100-4 may be interposed in antenna resonating arm 96. Antenna tuning element 100-4 may be a continuously adjustable variable capacitor (as an example). If desired, additional tuning elements such tuning element 100-2 (e.g., continuously tunable or semi-continuously tunable capacitors, switchable inductors, etc.) may be coupled between the extended portion of arm 96 to ground G.

The placement of these tuning circuits 100 in FIGS. 4A, 4B, and 4C is merely illustrative and do not serve to limit the scope of the present invention. Additional capacitors and/or inductors may be added to ensure that each antenna tuning circuit 100 is not shorted circuited to ground at low frequencies (e.g., frequencies below 100 MHz). In general, antennas 40 in device 10 may include antennas with resonating elements that are formed from loop antenna structures, patch antenna structures, inverted-F antenna structures, slot antenna structures, planar inverted-F antenna structures, helical antenna structures, hybrids of these designs, etc. At least a portion of antennas 40 in device 10 may contain at least one antenna tuning element 100 (formed at any suitable location on the antenna) that can be adjusted so that wireless circuitry 34 may be able to cover the desired range of communications frequencies.

Figure 5A:
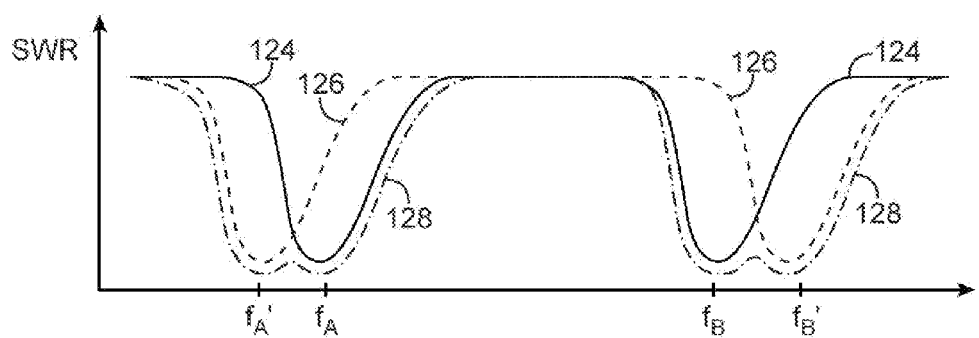
FIGS. 5A and 5B are plots showing how antennas containing tuning elements may be used to cover multiple communications bands of interest in accordance with an embodiment of the present invention.

By dynamically controlling antenna tuning elements 100, antenna 40 may be able to cover a wider range of radio-frequency communications frequencies than would otherwise be possible. A standing-wave-ratio (SWR) versus frequency plot such as SWR plot of FIG. 5A illustrates the band tuning capability for antenna 40. As shown in FIG. 5A, solid SWR frequency characteristic curve 124 corresponds to a first antenna tuning mode in which antenna 40 exhibits satisfactory resonant peaks at low-band frequency $f_A$ (e.g., to cover the 850 MHz band) and high-band frequency $f_B$ (e.g., to cover the 1900 MHz band). In the first antenna tuning mode, the antenna tuning elements 100 of antenna 40 may be placed in a first configuration (e.g., antenna tuning elements 100 may be provided with a first set of control signals).

Dotted SWR frequency characteristic curve 126 corresponds to a second antenna tuning mode in which the antennas of device 10 exhibits satisfactory resonant peaks at low-band frequency $f_A'$ (e.g., to cover the 750 MHz band) and high-band frequency $f_B'$ (e.g., to cover the 2100 MHz band). In the second antenna tuning mode, the antenna tuning elements 100 may be placed in a second configuration that is different than the first configuration (e.g., antenna tuning circuits 100 may be provided with a second set of control signals that is different than the first set of control signals).

If desired, antenna 40 may be placed in a third antenna tuning mode in which antenna 40 exhibits satisfactory resonant peaks at both low-band frequencies $f_A'$ and $f_A$ (e.g., to cover both the 750 and 850 MHz bands) and at high-band frequencies $f_B$ and $f_B'$ (e.g., to cover both the 1900 and 2100 MHz bands), as shown by SWR characteristic curve 128. In the third antenna tuning mode, the antenna tuning elements 100 may be placed in a third configuration that is different than the first and second configurations (e.g., antenna tuning elements 100 may be provided with a third set of control signals that is different than the first and second sets of control signals). A combination of tuning methods may be used so that the resonance curve 128 exhibits broader frequency ranges than curves 124 and 126.

Figure 5B:
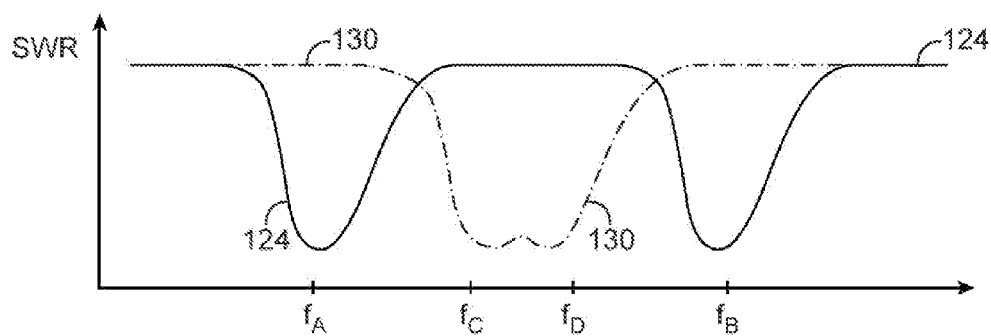

In another suitable arrangement, antenna 40 may be placed in a fourth antenna tuning mode in which antenna 40 exhibits satisfactory resonant peaks at mid-band frequencies $f_C$ and $f_D$ (e.g., to cover frequencies between the low and high bands), as shown by SWR characteristic curve 130 of FIG. 5B. In the fourth antenna tuning mode, the antenna tuning circuits 100 may yet be placed in another different configuration. The SWR curves of FIGS. 5A and 5B are merely illustrative and do not serve to limit the scope of the present invention. In general, antenna(s) 40 may include antenna tuning circuits 100 that enable device 10 to transmit and receive wireless signals in any suitable number of radio-frequency communications bands.

Figure 6A:
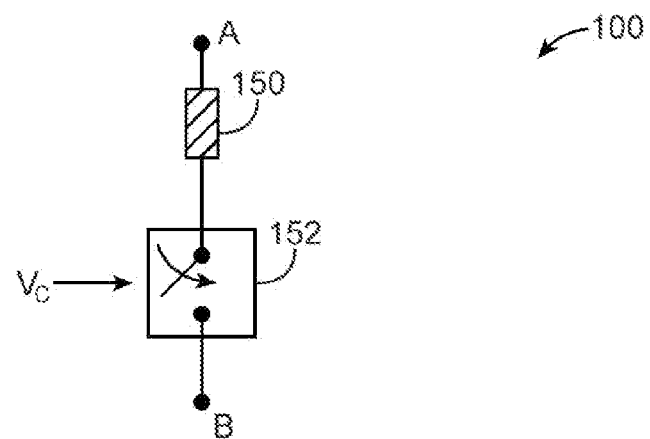
FIGS. 6A and 6B are circuit diagrams of illustrative switchable load circuits that may be used as antenna tuning elements in accordance with an embodiment of the present invention.

Antenna tuning element 100 may be any switchable or tunable electrical component that can be adjusted in real time. Antenna tuning element 100 may have a first terminal A and a second terminal B that may be coupled to desired locations on antenna resonating element 41 and a third terminal operable to receive control signal Vc from control circuit 102. FIG. 6A shows one suitable circuit implementation of tunable element 100. As shown in FIG. 6A, element 100 may include a radio-frequency switch 150 and a load circuit 152 coupled in series between terminals A and B. Switch 152 may be implemented using a p-i-n diode, a gallium arsenide field-effect transistor (FET), a microelectromechanical systems (MEMs) switch, a metal-oxide-semiconductor field-effect transistor (MOSFET), a high-electron mobility transistor (HEMT), a pseudomorphic HEMT (PHEMT), a transistor formed on a silicon-on-insulator (SOI) substrate, etc. The state of the switch can be controlled using signal Vc generated from control circuit 102 (see, e.g., FIG. 3). For example, a high Vc will turn on or close switch 402 whereas a low Vc will turn off or open switch 402.

Load circuit 152 may be formed from one or more electrical components. Components that may be used as all or part of circuit 152 include resistors, inductors, and capacitors. Desired resistances, inductances, and capacitances for circuit 152 may be formed using integrated circuits, using discrete components (e.g., a surface mount technology inductor) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path (e.g., a transmission line) on a printed circuit board.

Figure 6B:
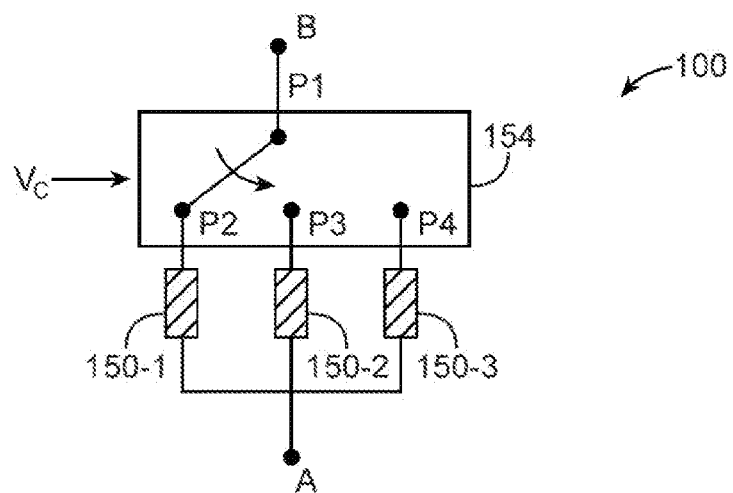

In another suitable arrangement, tunable element 100 may include a switch 154 (e.g., a single-pole triple-throw radio-frequency switch) and multiple load circuits 150-1, 150-2, and 150-3. As shown in FIG. 6B, switch 154 may have ports P1, P2, P3, and P4. Terminal B of tunable element 100 may be coupled to port P1 while terminal A of tunable element 100 may be coupled to port P2 via circuit 150-1, to port P3 via circuit 150-2, and to port P4 via circuit 150-3. As described previously, load circuits 150-1, 150-2, and 150-3 may include any desired combination of resistive components, inductive components, and capacitive components formed using integrated circuits, discrete components, or other suitable conductive structures. Switch 154 may be controlled using signal Vc generated by control circuit 102. For example, switch 154 may be configured to couple port P1 to P2 when Vc is at a first value, to couple port P1 to P3 when Vc is at a second value that is different than the first value, and to couple port P1 to P4 when Vc is at a third value that is different than the first and second values.

The example of FIG. 6B in which tunable element 100 includes three impedance loading circuits is merely illustrative and does not serve to limit the scope of the present invention. If desired, tunable element 100 may include a radio-frequency switch having any number of ports configured to support switching among any desired number of loading circuits. If desired, switch 154 may be configured such that more than one of the multiple loading circuits 150 may be coupled to port P1 in parallel.

Figure 6C:
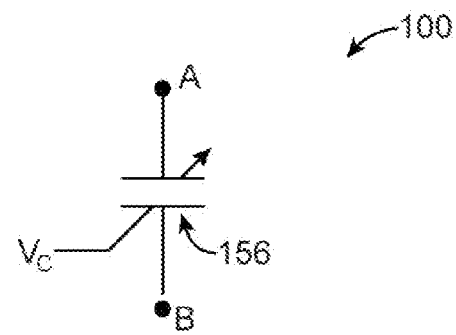
FIG. 6C is a circuit diagram of an illustrative variable capacitor circuit that may be used as an antenna tuning element in accordance with an embodiment of the present invention.

In another suitable arrangement, tunable element 100 may include a variable capacitor circuit 156 (sometimes referred to as a varactor). As shown in FIG. 6C, varactor may have first terminal A, second terminal B, and a control terminal operable to receive signal Vc from control circuit 300. Control circuit 102 may be adjusted so that Vc adjusts the capacitance of varactor 156 to the desired amount. Varactor 156 may be formed using integrated circuits, one or more discrete components (e.g., SMT components), etc. In general, varactor 156 may be continuously variable capacitors or semi-continuously adjustable capacitors.

Having antenna tuning element 100 as part of antenna 40 introduces an additional component that needs to be characterized, because the design of antenna tuning element 100 can substantially impact the antenna performance of device 10. For example, the position at which element 100 is placed relative to the antenna feed terminals, the orientation of element 100 within device 10, and other design factors associated with element 100 can affect the wireless operation of device 10. It may therefore be desirable to have a way of characterizing the performance of antenna tuning element 100 to provide guidance in the antenna design of device 10.

Figure 7:
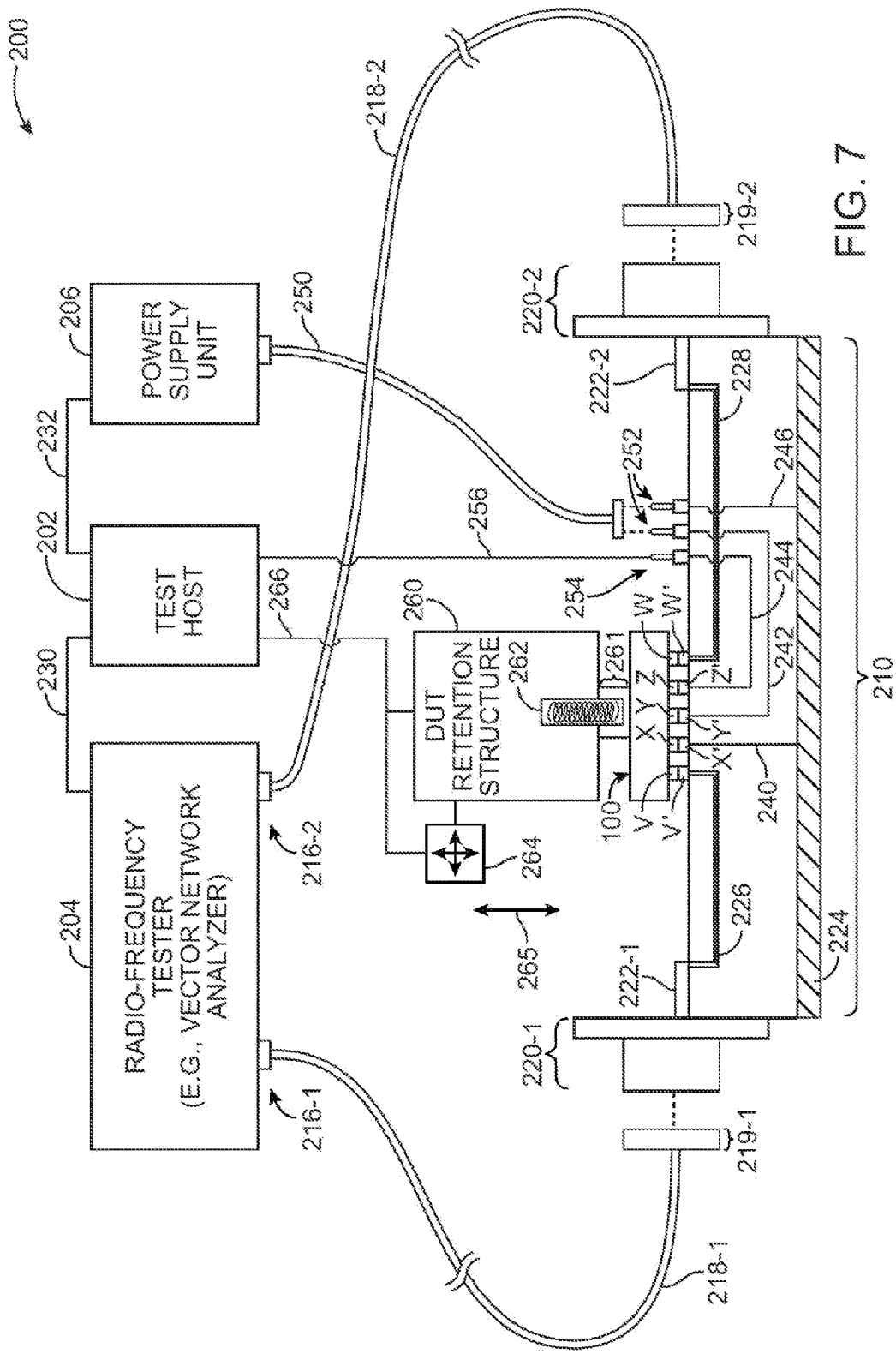
FIG. 7 is a diagram of an illustrative test system that includes a device under test (DUT) retention structure in accordance with an embodiment of the present invention.

In accordance with an embodiment of the present invention, antenna tuning element 100 may be tested using a test system such as test system 200 of FIG. 7. An antenna tuning element 100 that is being characterized using test system 200 may sometimes be referred to as a device under test (DUT). As shown in FIG. 7, test system 200 may include a test host such as test host 202 (e.g., a personal computer), a radio-frequency tester such as radio-frequency tester 204, a power supply unit such as power supply unit 206, a test substrate such as test substrate 210, control circuitry, network circuitry, cabling, and other test equipment.

DUT 100 may be placed on top of test substrate 210 during testing. Substrate 210 may be a plastic support structure or other dielectric structure, a rigid printed circuit board substrate such as a fiberglass-filled epoxy substrate (e.g., FR4), a flexible printed circuit ("flex circuit") formed from a sheet of polyimide or other flexible polymer, or other substrate material. The use of substrate 210 is merely illustrative. In general, test system 200 may include a test fixture having any suitable type of DUT receiving structure (e.g., a printed circuit board, a metal platform, a dielectric support structure, a receptacle having a recess, a test socket, etc.) that is configured to mate with DUT 100 during testing.

DUT 100 may, for example, include conductive pads V, W, X, Y, and Z that serve as contact terminals for interfacing with external circuitry and may therefore sometimes be referred to as DUT contacts. In the example of FIG. 7, pad V may serve as terminal A for DUT 100, whereas pad W may serve as terminal B for DUT 100 (see, e.g., FIGS. 6A, 6B, and 6C). Pads X and Y may serve as power supply terminals (e.g., positive and ground power supply voltages may be supplied to DUT 100 via pads X and Y), whereas pad Z may serve as a control terminal (e.g., control signals for configuring the state of DUT 100 may be supplied via pad Z).

Test contact members configured to mate with the contact terminals of DUT 100 may be formed on substrate 210. As shown in FIG. 7, conductive pads V', W', X', Y', and Z' may be formed on substrate 210. Substrate 210 may have a first edge portion to which a first radio-frequency connector 220-1 is attached and a second edge portion to which a second radio-frequency connector 220-2 is attached. Connectors 220-1 and 220-2 may be coaxial connectors such as SubMiniature version A (SMA) connectors that provide a 50 ohm termination impedance for radio-frequency signals up to 18 GHz (as an example). This is merely illustrative. If desired, other types of connectors such as SubMiniature version B (SMB) connectors, SubMiniature version C (SMC) connectors, Bayonet Neill-Concelman (BNC) connectors, U.FL connectors, and other types of connectors may be used in test system 200.

Connector 220-1 may have a core signal conductor 222-1 that is coupled to pad V' via a signal trace 226 that is formed in substrate 210. Connector 220-2 may have a core signal conductor 222-2 that is coupled to pad W' via a signal trace 228 that is formed in substrate 210. Substrate 210 may include at least one layer such as layer 224 configured to serve as a ground reference for signals propagating through the conductive signal traces formed in other layers of substrate 210. Connectors 220-1 and 220-2 may each have an outer conductor that surrounds the core signal conductor and that is coupled to ground 224. Pad X' may be coupled to ground plane 224 through a conductive via 240.

Figure 11A:
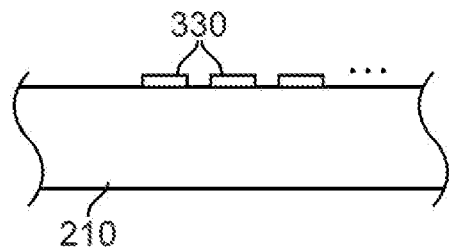
FIGS. 11A, 11B, and 11C are cross-sectional side views of illustrative coupling structures on a test board on which a DUT can be mounted during test in accordance with an embodiment of the present invention.
Figure 11B:
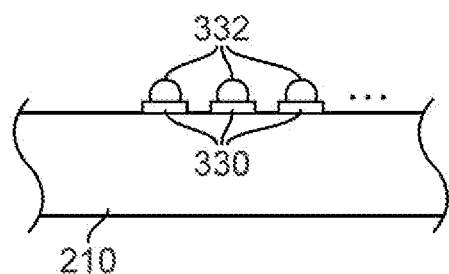
Figure 11C:
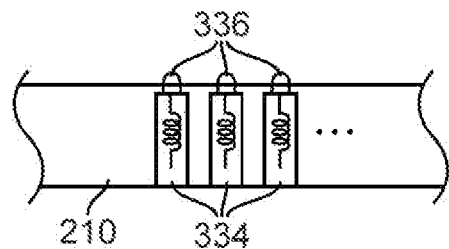

When DUT 100 is mated with test substrate 210, DUT contacts V, W, X, Y and Z may make physical and electrical contact with substrate contacts V', W', X', Y', and Z', respectively. As shown in FIG. 11A, contact pads 330 may represent only one suitable mating mechanism for interfacing with a corresponding DUT. In another suitable arrangement, protruding conductive features such as solder balls 332 may be formed on top of contact pads 330 (see, e.g., FIG. 11B). The presence of solder balls 332 may facilitate proper electrical connection between DUT 100 and the substrate contacts. In yet another suitable arrangement, pins such as pogo pins 334 may be embedded within test substrate 210. Each pin 334 may have a spring-loaded tip portion 336 configured to make electrical contact with DUT 100 when DUT 100 is mounted on substrate 210. These examples are merely illustrative. In general, test system 200 may include any type of DUT receiving structure having any suitable type of coupling mechanism for mating with DUT 100 during testing.

Power may be supplied to the mated DUT using test pins 252 formed on substrate 210. Power supply unit 206 may provide a positive power supply voltage and a ground power supply voltage to first and second test pins 252, respectively, via cable 250. First test pin 252 may be coupled to pad Y' via path 244 formed in substrate 210, whereas second test pin 252 may be coupled to test substrate ground plane 224 (i.e., to short layer 224 to ground). Moreover, power supply unit 206 can be used to monitor an amount of current that is drawn by DUT 100. Data reflective of the amount of current drawn by DUT 100 over time may be provided from power supply unit 206 to test host 202 via path 232. Monitoring current using power supply unit 206 in this way ensures that DUT 100 does not consume excessive amounts of power. If desired, test host 202 can also control the amount of power that is supplied to DUT 100 by sending appropriate power adjustment settings to unit 206 via path 232.

The example of FIG. 7 in which power is supplied to DUT 100 is suitable for an antenna tuning element that contains at least one active component (i.e., a electrical component that needs to be actively powered for proper operation). As an example, radio-frequency switch 152 of FIG. 6A may be an active component that needs to be powered during testing. In other arrangements, DUT 100 may not include active components. When DUT 100 only includes passive electrical components (e.g., resistors, capacitors, inductors, and/or other passive load elements), power need not be supplied to DUT 100 during testing.

Control signals for configuring the state of DUT 100 may be supplied to the mated DUT using test pin 254. For example, test host 202 may provide appropriate control signals Vc that place DUT 100 in the desired state via path 256 that is coupled to pin 254. Consider a scenario in which DUT 100 is a varactor of the type shown in FIG. 6B. During a first test iteration, test host 202 may send control signals to DUT 100 via path 236 that configure switch 154 to connect ports P1 and P2. During a second test iteration, test host 202 may send control signals to DUT 100 via path 236 that configure switch 154 to connect ports P1 and P3. During a third test iteration, test host 202 may send control signals to DUT 100 via path 236 that configure switch 154 to connect ports P1 and P4. It is generally desirable to characterize DUT 100 in a variety of potential operating states using test system 200.

The example of FIG. 7 in which only five contacts are shown is merely illustrative. In general, DUT 100 may include at least one contact terminal, at least two contact terminals, at least five contact terminals, at least ten contact terminals, or any suitable number of contact terminals for interfacing with external circuitry (e.g., for interfacing with test equipment during testing and for interfacing with other antenna structures during normal device operation).

Conductive traces 226 and 228 and associated ground plane 224 formed as a part of substrate 210 in this way may collectively serve as a microstrip transmission line path through which radio-frequency test signals may be conveyed during testing. In general, substrate 210 may be configured to form any suitable transmission line path such as stripline transmission lines, edge coupled microstrip transmission lines, edge coupled stripline transmission lines, or other suitable transmission line structures through which radio-frequency signals may be conveyed.

Tester 204 may be used to generate radio-frequency test signals that are fed to DUT 100 via the transmission lines formed on substrate 210. Radio-frequency tester 204 may be a vector network analyzer (as an example). Tester 204 may have a first port 216-1 to which a first radio-frequency cable 218-1 is connected and a second port 216-2 to which a second radio-frequency cable 218-2 is connected. Radio-frequency cables 218-1 and 218-2 may, for example, be coaxial cables. In particular, first cable 218-1 may have a first end that is connected to tester port 216-1 and a second end terminating at a first radio-frequency connector 219-1. Similarly, second cable 218-2 may have a first end that is connected to tester port 216-2 and a second end terminating at a second radio-frequency connector 219-2. The first port 216-1 of tester 204 may be electrically connected to terminal A of a mounted DUT by mating connectors 219-1 and 220-1, whereas the second port 216-2 of tester 204 may be electrically connected to terminal B of the mounted DUT by mating connectors 219-2 and 220-2. Connected using this arrangement, tester 204 may be configured to gather desired radio-frequency measurements such as radio-frequency two-port network parameters from DUT 100. Radio-frequency tester 204 may receive commands from test host 202 via path 230 that direct tester 204 to gather desired radio-frequency measurement. If desired, test data can be provided from tester 204 to test host 202 via path 230.

Radio-frequency tester 204 may be configured to produce radio-frequency test signals that are applied to DUT 100 via cables 218 (e.g., cables 218-1 and 218-2) and test substrate 210. Even without being connected to other components to form a completed antenna assembly, DUT 100 may emit radio-frequency signals when being energized by the test signals generated using tester 204. As electromagnetic test signals are transmitted by tester 204 and applied to DUT 100 through test cable 218-1, corresponding emitted electromagnetic test signals may be received through test cable 218-2 (as an example). Tester 204 may also receive reflected signals via cable 218-1 (i.e., signals that were reflected from DUT 100 in response to the signals transmitted through test cable 218-1).

The reflected signals gathered in this way may be used to compute a reflection coefficient (sometimes referred to as an S11 parameter or S11 scattering parameter). The transmitted signals on cable 218-1 and corresponding received signals on cable 218-2 may be used to compute a forward transfer coefficient (sometimes referred to as an S21 parameter or S21 scattering parameter). The S11 and S21 data may include magnitude and phase components.

Similarly, tester 204 may also transmit test signals to DUT 100 through test cable 218-2. As test electromagnetic signals are transmitted by tester 204 and applied to DUT 100 through test cable 218-2, corresponding emitted electromagnetic test signals may be received through test cable 218-1. Tester 204 may also receive reflected signals via cable 218-2 (i.e., signals that were reflected from DUT 100 in response to the signals transmitted through test cable 218-2). The emitted and reflected signals gathered in this way may be used to compute reflection coefficient data (sometimes referred to as an S22 scattering parameter) and forward transfer coefficient data (sometimes referred to as an S12 scattering parameter).

Test host 202 may, for example, analyze the scattering parameter test data to determine whether DUT 100 satisfies design criteria. If the gathered test data deviates from a predetermined level by an unacceptable amount, DUT 100 may be marked as defective. If the gathered test data deviates from the predetermined level by a tolerable amount, DUT 100 may be marked as a passing device. The use of tester 204 for obtaining scattering parameter test data from DUT 100 is merely illustrative and does not serve to limit the scope of the present invention. If desired, tester 204 may be used to gather other types of radio-frequency measurements from DUT 100.

When DUT 100 is mated with substrate 210, there needs to be a way for securing the position of DUT 100 so that DUT 100 is properly connected to the corresponding test contacts on substrate 210 and so that DUT 100 does not accidentally shift during testing. Conventionally, surface mount components under test are soldered to receiving test fixtures. Soldering DUT 100 to substrate 210 can, however, potentially damage DUT 100 due to excess amounts of heat that is generated from soldering equipment. It may therefore be desirable to have a way of fixing the position of DUT 100 on top of substrate 210 while imparting minimal stress on DUT 100.

In one suitable embodiment of the present invention, test system 200 may include a DUT retention structure such as DUT retention structure 260. DUT retention structure 260 may include a pressure sensing circuit 262 operable to detect an amount of pressure that is applied at a tip portion 261. Pressure sensor 262 may produce a pressure sensor output value Dpres that is proportional to the amount of pressure (or force) that is exerted onto tip 261. In one suitable arrangement, sensor output value Dpres may be output in the form of a digital signal. In other suitable embodiments, the pressure sensor output value may be output in the form of an analog signal. Pressure sensor output value Dpres may be fed to test host 202 via path 266.

During testing, tip portion 261 of DUT retention structure 260 may be positioned over DUT 100 and may be lowered to make physical contact with DUT 100. Configured in this way, DUT retention structure 260 may be used to apply a sufficient amount of pressure on DUT 100 so that DUT 100 is properly mated with test substrate 210 and so that DUT 100 will not be accidentally knocked out of place during testing. DUT retention structure 260 having tip 261 that is used as such may sometimes be referred to as a "plunger." Tip 261 may be formed using non-marring material such as acetyl plastic, Delrin® (a polyoxymethylene plastic), other plastics, or other suitable non-marring materials. The use of non-marring materials may help avoid scratches or other damage to DUT 100 when tip 261 is pressed against the surface of DUT 100.

Figure 10A:
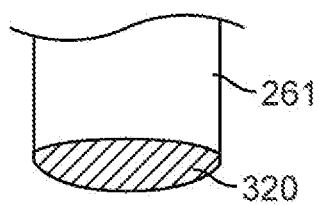
FIGS. 10A, 10B, and 10C are diagrams showing different types of tips that can be used as part of a DUT retention structure in accordance with an embodiment of the present invention.
Figure 10B:
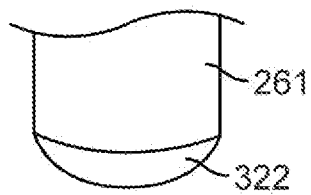
Figure 10C:
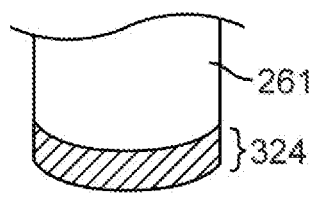

FIG. 10A shows one suitable shape for tip 261. As shown in FIG. 10A, tip 261 may have a flat planar surface 320 configured to make contact with a corresponding surface on DUT 100. In another suitable arrangement, tip 261 may have a rounded surface 322 configured to make contact with DUT 100 (see, e.g., FIG. 10B). In yet another suitable arrangement, an additional layer of compressible material such as material 324 may be attached to the end of tip 261 (see, e.g., FIG. 10C). Material 324 may be formed using rubberized foam or other suitable elastomeric material. These configurations for tip 261 are merely illustrative. If desired, tip portion 261 of plunger 260 may have any suitable shape for making contact with DUT 100.

The position of plunger 260 may be controlled using a positioner such as positioner 264. Positioner 264 may be a computer-controlled device (e.g., a positioning device that receives commands from test host 202 via path 266) or a manually-controlled positioning device (e.g., a positioning device that is controlled via knob adjustments from test personnel) having actuators for controlling the height of plunger 260 in the direction of arrows 265 (as an example).

Figure 8:
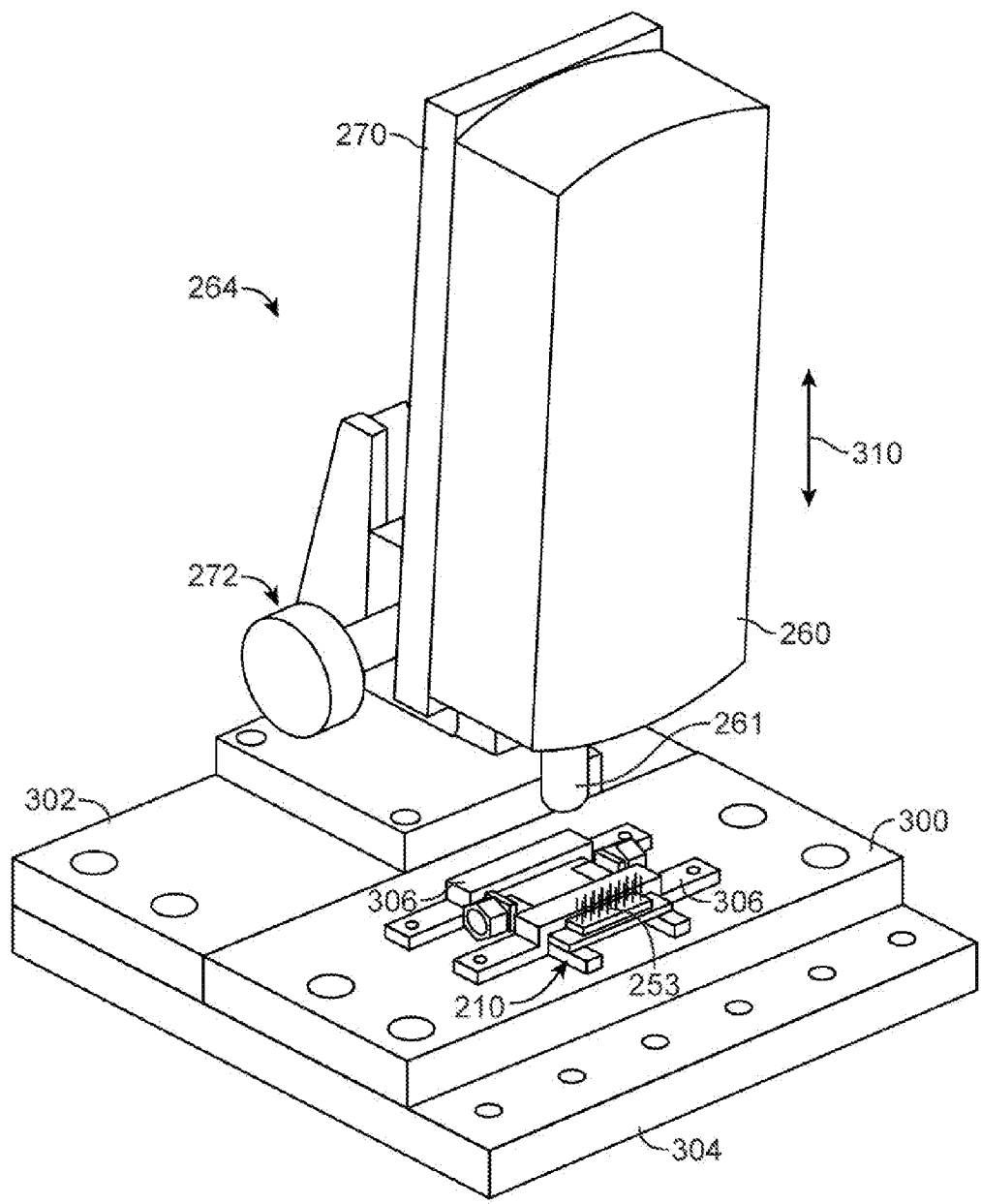
FIGS. 8 and 9 are perspective views of a DUT retention structure that is controlled using an associated positioner in accordance with an embodiment of the present invention.

FIG. 8 shows a perspective view of test system 200. Test substrate 210 may be secured to a first base member 300 using clamps such as clamps 306. Test pins 253 may be formed on substrate 210. Test pins 253 may include power supply signal pins 252, control signal pins 254, and other pins that can be used to access DUT 100. Positioner 264 may be secured on top of a second base member 302 that is adjacent to first base member 300. The first and second base members may be secured to test platform 304 (sometimes referred to as a test platen). Base members 300 and 302, clamps 306, and platform 304 may be constructed using metal, plastic, or other durable materials.

As shown in FIG. 8, plunger 260 may be attached to a vertical arm 270. Positioner 264 may include a first linear position adjustment mechanism such as a coarse tuning knob 272 that is used to make coarse height (linear) adjustments for vertical arm 270 in direction 310. For example, the height of plunger 260 may be adjusted in 1 mm steps using tuning knob 272.

Figure 9:
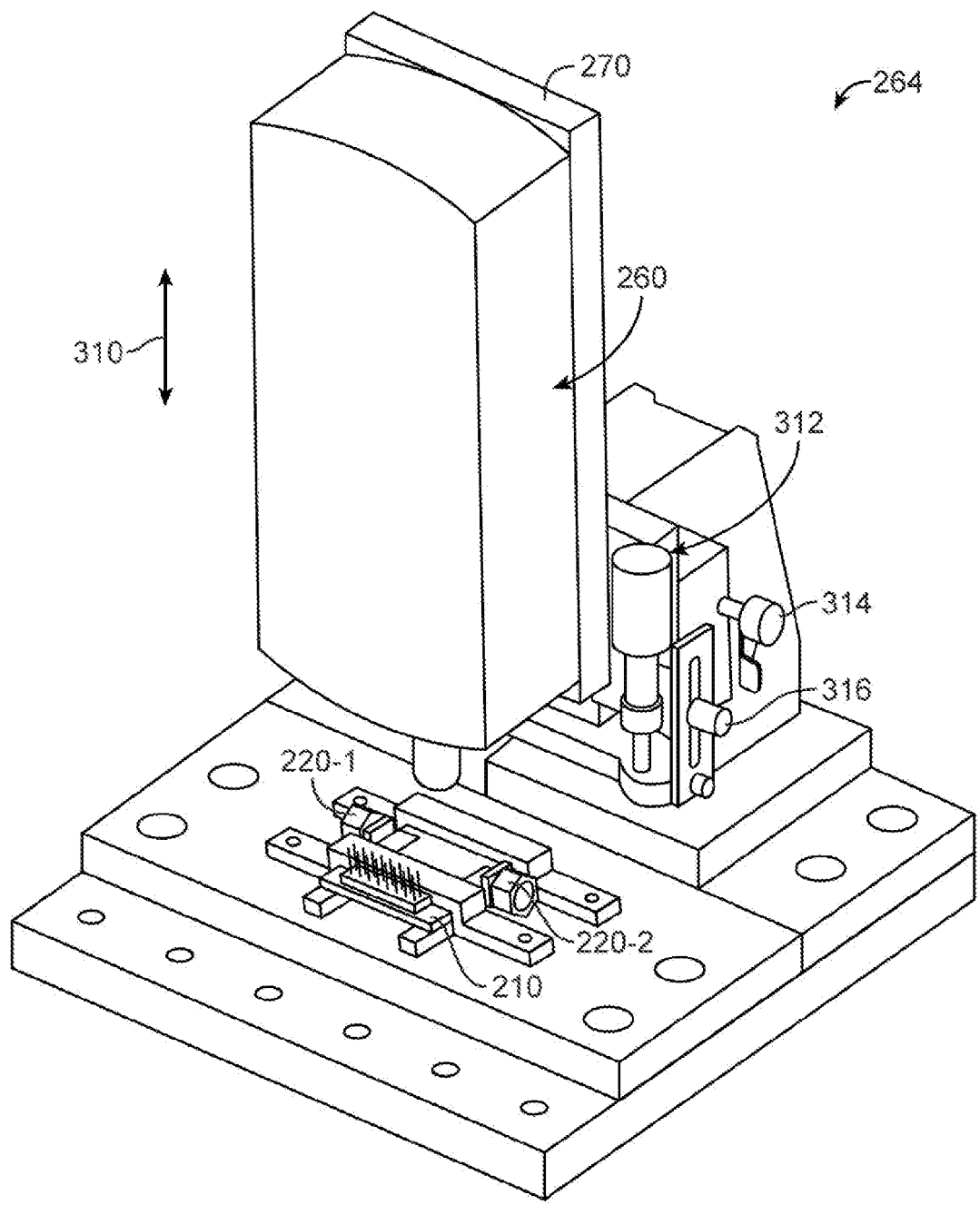

Positioner 264 may also include a second linear position adjustment mechanism such as a fine tuning knob 312 that is used to make fine height adjustments for vertical arm 270 in direction 310 (see, e.g., FIG. 9). For example, the height of plunger 260 may be adjusted in 0.1 mm steps using tuning knob 310. In general, the step size associated with fine tuning knob 310 can be any suitable fraction of the step size associated with coarse tuning knob 272. Positioner 264 may also include a coarse tuning lock 314 and a fine tuning lock 316. Tuning locks 314 and 316 may be used to prevent damage to DUT 100 by providing a hard stop when plunger 260 is lowered to a minimum allowable distance separating tip 261 from the surface of test substrate 210.

Generally, the different knobs in positioner 264 (e.g., tuning knobs 272, 312, 314, and 316) may be controlled manually by test personnel or may be controlled pneumatically/ automatically based on commands from test host 202. The example of FIGS. 7 and 8 in which positioner 264 has two tuning knobs offering two degrees of positioning accuracy is merely illustrative. If desired, positioner 264 may include less than two or more than two positioning adjustment mechanisms for controlling the vertical and/or horizontal position of plunger 260 in any desired step size (e.g., in 1 mm positioning resolution, in 0.1 mm positioning resolution, in 0.05 mm positioning resolution, in 0.01 mm positioning resolution, etc.).

Figure 12:
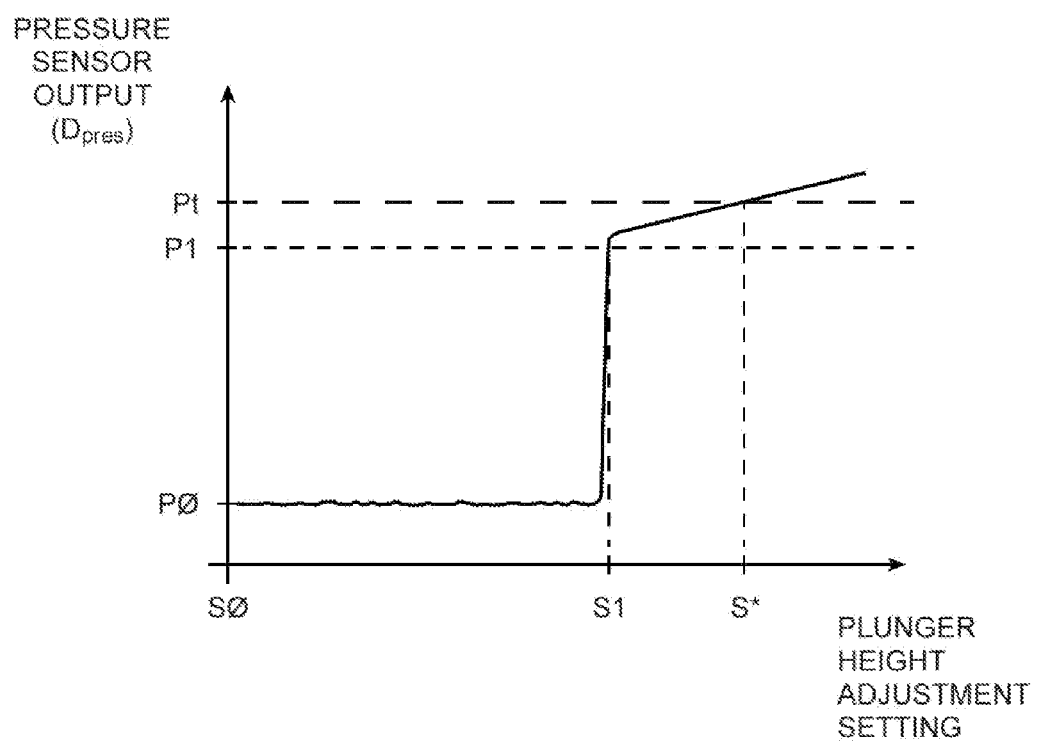
FIG. 12 is a plot of pressure sensor output value versus DUT retention structure positioner adjustment settings in accordance with an embodiment of the present invention.

FIG. 12 is a plot showing how pressure sensor output Dpres may vary as a function of a plunger height adjustment setting that is reflective of the current state of coarse tuning knob 272 and fine tuning knob 312. When the height adjustment setting is initialized to S0, plunger 260 may be raised to a maximum height within the capabilities of positioner 264. At this maximum height, tip 261 should not be in contact with DUT 100, and sensor 262 may provide a baseline sensor output value of P0. As the plunger height adjustment setting is increased (e.g., using coarse tuning knob 272), plunger 260 may gradually be lowered until DUT 100 makes physical contact with DUT 100.

When plunger 260 makes contact with DUT 100, output Dpres may increase substantially from the baseline reading of P0 to an elevated reading P1 (see, corresponding plunger height adjustment setting S1). At this point, plunger 260 may be further lowered until Dpres exceeds a predetermined pressure threshold level Pt (e.g., by further incrementing the plunger height adjustment setting using fine tuning knob 314). The height adjustment setting corresponding to the point at which Dpres exceeds a predetermined threshold Pt may be referred to as a critical adjustment setting S*. It may be desirable to gather critical adjustment settings S* across multiple samples for a given type of DUT and for different types of DUTs.

Figure 13:
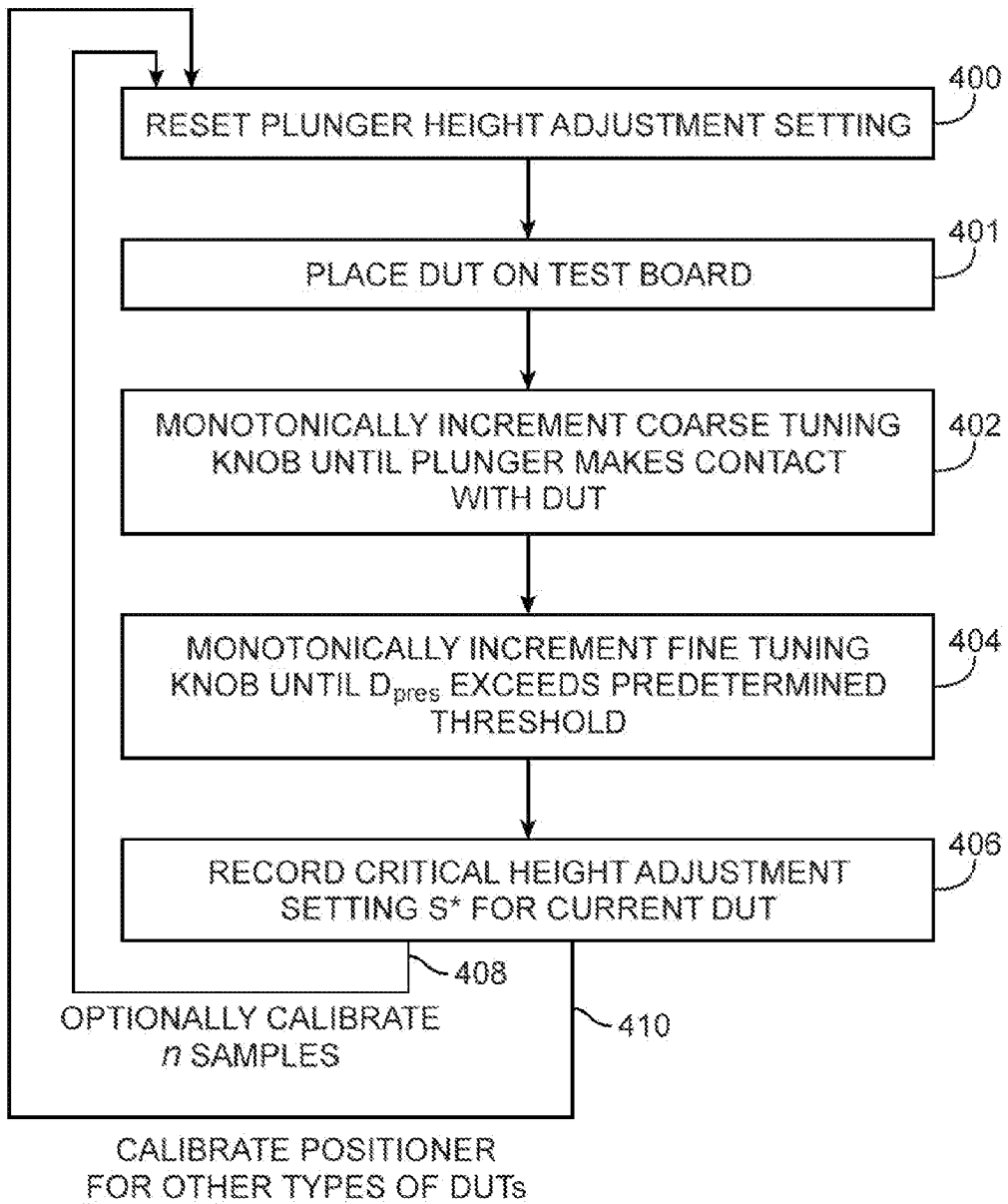
FIG. 13 is a flow chart of illustrative steps for calibrating a test system to obtain critical DUT retention structure positioner adjustment settings in accordance with an embodiment of the present invention.

FIG. 13 shows illustrative steps involved in obtaining critical adjustment settings S* when calibrating test station 200. At step 400, the plunger height adjustment setting may be reset to S0 so that positioner 264 raises plunger 260 to its maximum height. At step 401, DUT 100 may be placed on test board 210 (e.g., so that DUT contacts V, W, X, Y, and Z are aligned to corresponding test contacts V', W', X', Y', and Z').

At step 402, coarse tuning knob 272 may be monotonically adjusted to gradually lower plunger 260 until plunger 260 makes contact with DUT 100. By monitoring when pressure sensor output Dpres spikes upward as plunger 260 is lowered (see, FIG. 12), it is possible to determine when plunger 260 makes physical contact with DUT 100. Once plunger 260 is in contact with DUT 100, no additional adjustment to coarse tuning knob 272 should be made.

At step 404, fine tuning knob 312 may be monotonically adjusted to gradually lower plunger 260 until Dpres exceeds a predetermined threshold pressure (i.e., a pressure level which ensures that DUT 100 is securely pressed against test board 210). Once Dpres has reached the predetermined threshold pressure, no additional adjustment to fine tuning knob 312 should be made.

At step 406, the current state of coarse tuning knob 272 and fine tuning knob 312 may collectively represent the critical height adjustment setting S* for DUT 100 that is presently being tested. Due of variations in semiconductor packaging processes, it is possible that two samples of an electrical component have different package thicknesses. It may therefore be desirable to calibrate test station 200 by testing more than one sample to ensure that plunger 260 applies sufficient pressure on multiple DUTs 100 in a production line. For example, n samples of the same type of DUT may be tested to obtain a distribution of critical height adjustment settings S* (as indicated by path 408). If desired, processing may loop back to step 400 to calibrate test station 200 using different types of DUTs (see, e.g., the different types of antenna tuning elements of FIGS. 6A, 6B, and 6C), as indicated by path 410.

The steps of FIG. 13 are merely illustrative and do not serve to limit the scope of the present invention. The steps of FIG. 13 may be performed manually by a test operator or may be performed automatically using test software running on test host 202. In the scenario where the calibration method is automated, a closed loop control system having actuators for moving plunger 260, stepper motors for adjusting knobs 272 and 312, a pressure sensor for monitoring the real-time pressure at the tip of plunger 260, and other electrical test equipment may be used. The actuators and stepper motors may be adjusted in a controlled fashion while the electrical response that is measured using the pressure sensor is being monitored. When this electrical response meets or exceeds a predetermined threshold, a critical pressure setting is recorded. These steps may be repeated on a sample of reference devices to gather numerous critical pressure settings. An average pressure setting may then be computed and used as the operating pressure setting as applied to the DUTs during production testing.

Figure 14:
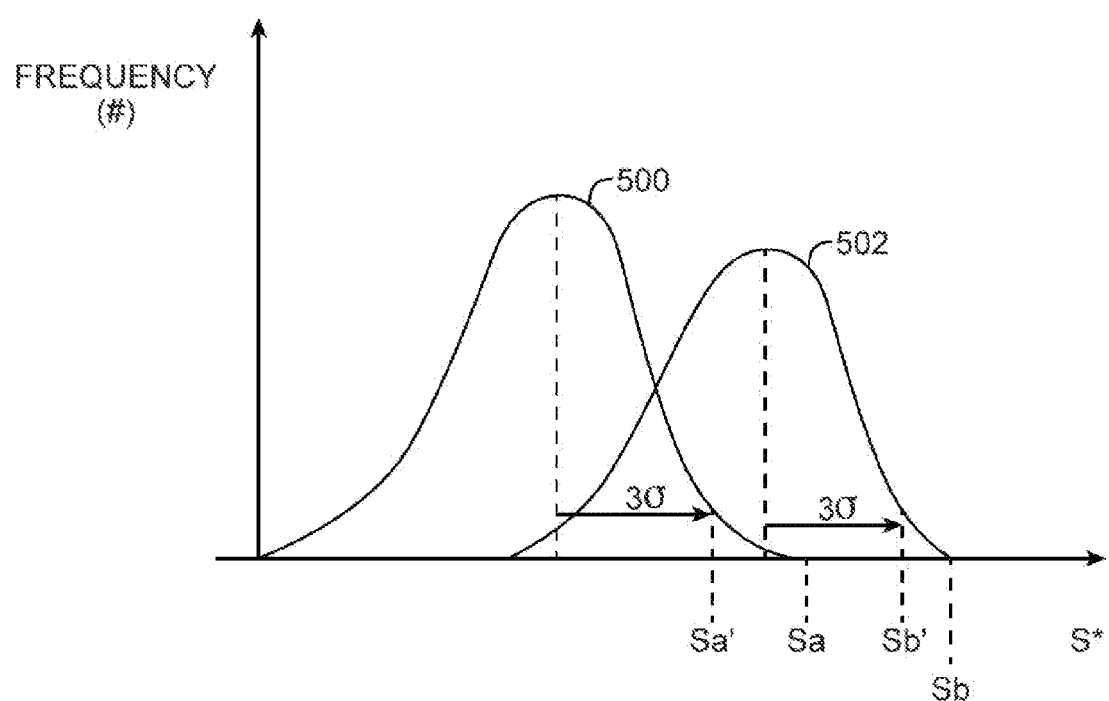
FIG. 14 is a frequency distribution plot of critical DUT retention structure positioner adjustments settings gathered from two different types of DUTs in accordance with an embodiment of the present invention.

FIG. 14 is a frequency distribution plot showing test data that may be gathered using the steps described in connection with FIG. 13. Curve 500 may represent a distribution profile for critical adjustment settings S* associated with a first type of DUT, whereas curve 502 may represent a distribution profile for critical adjustment settings S* associated with a second type of DUT that is different than the first type of DUT.

Setting Sa may be obtained by sampling the rightmost S* that is part of curve 500 and may represent a setting that, if applied to positioner 264, will allow all DUTs of the first type to receive at least the predetermined threshold pressure from plunger 260. Setting Sa' may be obtained by computing an S* that is three standard deviations ($3\sigma$) to the right of the mean of curve 500 and may represent a setting that, if applied to positioner 264, will allow more than 99% of DUTs of the first type to receive at least the predetermined threshold pressure from plunger 260.

Setting Sb may be obtained by sampling the rightmost S* that is part of curve 502 and may represent a setting that, if applied to positioner 264, will allow all DUTs of the second type to receive at least the predetermined threshold pressure from plunger 260. Setting Sb' may be obtained by computing an S* that is three standard deviations ($3\sigma$) to the right of the mean of curve 502 and may represent a setting that, if applied to positioner 264, will allow more than 99% of DUTs of the second type to receive at least the predetermined threshold pressure from plunger 260.

Figure 15:
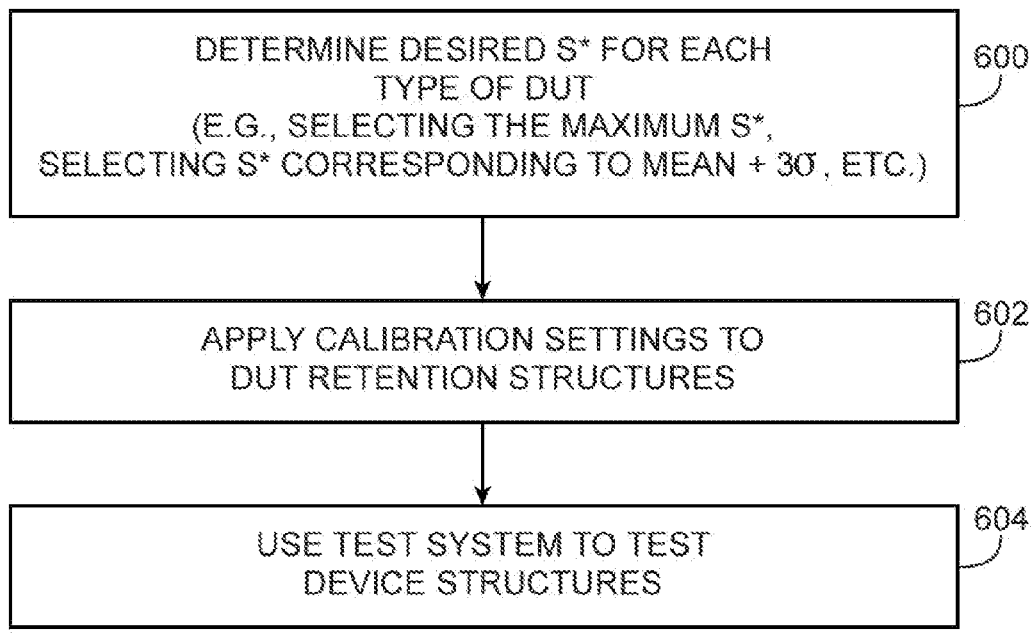
FIG. 15 is a flow chart of illustrative steps for operating the test system of FIG. 7 in accordance with an embodiment of the present invention.

FIG. 15 is a flow chart of illustrative steps for processing and applying the calibration data. At step 600, test host 202 may select a desired S* for each type of DUT. As an example, test host 202 may select Sa to be the primary setting for configuring positioner 264 when using test system 200 to test a DUT of the first type. As another example, test host 202 may select Sa' to be the primary setting for configuring positioner 264 when using test system 200 to test a DUT of the first type. Different types of DUTs may therefore be tested using different primary plunger height adjustment settings determined during step 600. If desired, test host 202 may alternatively select a single master adjustment setting for configuring positioner 264 regardless of the type of DUT being tested. For example, the master plunger height adjustment setting may be computed by taking the maximum of Sa' and Sb' (if only two types of DUTs are being tested). Other ways of selecting the master plunger height adjustment setting may be used.

At step 602, the calibration settings determined during step 600 may be stored on test host 202 and may be applied to positioner 264 so that plunger 260 will be configured to apply sufficient pressure on a corresponding DUT during production testing. At step 604, calibration of positioner 264 is complete and test system 200 may be used to test any suitable electrical components suitable for mounting on test substrate 210.

The foregoing is merely illustrative of the principles of this invention and various modifications can be made by those skilled in the art without departing from the scope and spirit of the invention. The foregoing embodiments may be implemented individually or in any combination.

What is claimed is:

1. A test system for testing a device under test having device under test contacts, comprising:
   a device receiving structure having first and second opposing sides and device receiving structure contacts configured to receive the device under test contacts when the device under test is mated with the device receiving structure;
   a device retention structure configured to press the device under test against the device receiving structure with a calibrated amount of pressure;
   a radio-frequency tester that is coupled to the device receiving structure and that is configured to obtain radio-frequency measurements from the device under test;
   a first radio-frequency connector that is attached to the first side of the device receiving structure and coupled to the radio-frequency tester, wherein the first radio-frequency connector comprises a first core signal conductor that is coupled to a first device receiving structure contact; and
   a second radio-frequency connector that is attached to the second side of the device receiving structure and coupled to the radio-frequency tester, wherein the second radio-frequency connector comprises a second core signal conductor that is coupled to a second device receiving structure contact, the first and second device receiving structure contacts contact respective first and second device under test contacts, the first and second device under test contacts are positioned at respective first and second opposing sides of the device under test, the device receiving structure contacts comprise third, fourth, and fifth device receiving structure contacts, and the third device receiving structure contact is coupled to a ground plane.

2. The test system defined in claim 1, wherein the device under test comprises an antenna tuning element selected from the group consisting of: a radio-frequency switch, a tunable resistive component, a tunable capacitive component, and a tunable inductive component.

3. The test system defined in claim 1, further comprising:
   a positioner operable to move the device retention structure so that the device retention structure presses the device under test against the device receiving structure with the calibrated amount of pressure.

4. The test system defined in claim 3, wherein the positioner comprises a computer-controlled positioner, the test system further comprising:
   a test host configured to store calibration data, wherein the positioner moves the device retention structure towards the device under test by an amount specified by the stored calibration data.

5. The test system defined in claim 1, wherein the device retention structure includes a pressure sensor operable to detect an amount of force that is applied to the device under test from the device retention structure.

6. The test system defined in claim 5, further comprising:
a positioner operable to move the device retention structure, wherein the positioner is configured to move the device retention structure at a first rate when the device retention structure is not in contact with the device under test, and wherein the positioner is configured to the move the device retention structure at a second rate that is lower than the first rate when the device retention structure is in contact with the device under test.

7. The test system defined in claim 4, further comprising: a plurality of test pins, wherein the fourth device receiving structure contact is coupled to a first test pin of the plurality of test pins, and wherein the first test pin is coupled to the test host.

8. The test system defined in claim 7, wherein the fifth device receiving structure contact is coupled to a second test pin of the plurality of test pins, and wherein the second test pin is coupled to a power supply unit.

9. The test system defined in claim 8, wherein the ground plane is coupled to a third test pin of the plurality of test pins, wherein the third test pin is coupled to the power supply unit.

\* \* \* \* \*